(12) United States Patent
Scherer et al.

(10) Patent No.: US 9,589,768 B2
(45) Date of Patent: Mar. 7, 2017

(54) METHOD AND APPARATUS FOR PRODUCING A REFLECTION-REDUCING LAYER ON A SUBSTRATE

(71) Applicant: Leybold Optics GmbH, Alzenau (DE)

(72) Inventors: Michael Scherer, Kahl (DE); Jurgen Pistner, Alzenau-Michelbach (DE); Harro Hagedorn, Frankfurt a.M. (DE); Michael Klosch-Trageser, Freigericht-Neuses (DE)

(73) Assignee: Leybold Optics GmbH, Alzenau (DE)

( * ) Notice: Subject to any disclaimer, the term of this patent is extended or adjusted under 35 U.S.C. 154(b) by 0 days.

(21) Appl. No.: 14/348,417

(22) PCT Filed: Sep. 28, 2012

(86) PCT No.: PCT/EP2012/004093
§ 371 (c)(1),
(2) Date: Jul. 23, 2014

(87) PCT Pub. No.: WO2013/045111
PCT Pub. Date: Apr. 4, 2013

(65) Prior Publication Data
US 2014/0329095 A1 Nov. 6, 2014

(30) Foreign Application Priority Data
Sep. 28, 2011 (DE) .......... 10 2011 114 450

(51) Int. Cl.
*C23F 1/00* (2006.01)
*H01J 37/32* (2006.01)
(Continued)

(52) U.S. Cl.
CPC .... *H01J 37/32082* (2013.01); *C23C 14/0036* (2013.01); *C23C 14/021* (2013.01);
(Continued)

(58) Field of Classification Search
CPC ..... C23C 14/54; C23C 14/56; C23C 14/5826; C23C 14/0036; C23C 14/021;
(Continued)

(56) References Cited

U.S. PATENT DOCUMENTS 4,557,797 A * 12/1985 Fuller et al. .................. 438/514
5,776,557 A * 7/1998 Okano et al. ................. 427/579
(Continued)

FOREIGN PATENT DOCUMENTS

| DE | 10241708 A1 | 3/2004 |
|----|-------------|--------|
| DE | 102004036170 A1 | 3/2006 |

(Continued)

OTHER PUBLICATIONS

English translation of the International Preliminary Report on Patentability (Chapter I), International Application No. PCT/EP2012/004093, date of mailing, Apr. 10, 2014.

(Continued)

*Primary Examiner* — Lan Vinh
(74) *Attorney, Agent, or Firm* — Mintz Levin Cohn Ferris Glovsky and Popeo, P.C.

(57) ABSTRACT

The invention relates to an apparatus (1) for producing a reflection-reducing layer on a surface (21) of a plastics substrate (20). The apparatus comprises a first sputtering device (3) for applying a base layer (22) to the surface (21) of the plastics substrate (20), a plasma source (4) for plasma-etching the coated substrate surface (21), and a second sputtering device (5) for applying a protective layer (24) to the substrate surface (21). These processing devices (3, 4, 5) are arranged jointly in a vacuum chamber (2), which has inlets (8) for processing gases. In order to move the substrate (20) between the processing devices (3, 4, 5) in the interior of the vacuum chamber (2), a conveying apparatus (10) is provided which is preferably in the form of a rotary
(Continued)

table (11). Furthermore, the invention relates to a method for producing such a reflection-reducing layer on the surface (21) of the plastics substrate (20).

22 Claims, 5 Drawing Sheets

(51) Int. Cl.
  *C23C 14/00*  (2006.01)
  *C23C 14/02*  (2006.01)
  *C23C 14/50*  (2006.01)
  *C23C 14/52*  (2006.01)
  *C23C 14/56*  (2006.01)
  *H01J 37/34*  (2006.01)
  *C23C 14/34*  (2006.01)
  *C23C 14/58*  (2006.01)

(52) U.S. Cl.
  CPC .......... *C23C 14/022* (2013.01); *C23C 14/024* (2013.01); *C23C 14/34* (2013.01); *C23C 14/505* (2013.01); *C23C 14/52* (2013.01); *C23C 14/568* (2013.01); *C23C 14/5826* (2013.01); *H01J 37/32733* (2013.01); *H01J 37/32779* (2013.01); *H01J 37/32889* (2013.01); *H01J 37/34* (2013.01); *H01J 37/3408* (2013.01); *Y10T 428/31504* (2015.04)

(58) Field of Classification Search
  CPC ........ C23C 14/022; C23C 14/34; H01J 37/34; H01J 37/3402; H01J 37/3405; H01J 37/32889; H01J 37/3408; H01J 37/32779
  USPC ............... 216/41, 49, 58, 69, 70, 71, 79, 81; 156/345.41, 345.33, 345.4, 345.3, 345.31
  See application file for complete search history.

(56) References Cited

U.S. PATENT DOCUMENTS

| | | | |
|---|---|---|---|
| 6,458,253 B2* | 10/2002 | Ando | C23C 14/0694 204/192.12 |
| 7,875,341 B2* | 1/2011 | Toyoshima et al. | 428/212 |
| 2004/0033631 A1* | 2/2004 | Clark et al. | 438/14 |
| 2005/0233083 A1 | 10/2005 | Schulz et al. | |
| 2007/0117234 A1* | 5/2007 | Fork | C23C 14/14 438/23 |
| 2007/0224828 A1* | 9/2007 | Kushibiki et al. | 438/706 |
| 2008/0011603 A1* | 1/2008 | Nagashima | 204/192.25 |
| 2008/0210550 A1 | 9/2008 | Walther et al. | |
| 2008/0315270 A1* | 12/2008 | Marsh | B32B 25/00 257/292 |
| 2009/0261063 A1 | 10/2009 | Munzert et al. | |
| 2010/0033819 A1 | 2/2010 | Schulz et al. | |
| 2010/0053929 A1* | 3/2010 | Bisberg | H01L 33/58 362/84 |
| 2010/0133089 A1* | 6/2010 | Horiguchi | 204/192.15 |
| 2010/0301429 A1* | 12/2010 | Nabatame | 257/411 |
| 2011/0168544 A1* | 7/2011 | Shiono et al. | 204/192.1 |
| 2012/0067845 A1* | 3/2012 | Monden | H01J 37/32192 216/69 |
| 2013/0109189 A1* | 5/2013 | Cho | H01L 31/18 438/710 |
| 2013/0337657 A1* | 12/2013 | Savas | H01L 21/02274 438/778 |
| 2014/0329095 A1* | 11/2014 | Hagedorn et al. | 428/411.1 |

FOREIGN PATENT DOCUMENTS

| | | |
|---|---|---|
| DE | 102005049280 A1 | 6/2007 |
| DE | 102006056578 A1 | 6/2008 |
| DE | 102007059886 A1 | 6/2009 |
| DE | 102009018912 A1 | 11/2010 |
| EP | 1630248 A1 | 3/2006 |
| WO | WO-2004050944 A2 | 6/2004 |
| WO | WO-2010124836 A1 | 11/2010 |

OTHER PUBLICATIONS

International Search Report and Written Opinion, Jan. 16, 2013, International Patent Application PCT/EP2012/004093.

* cited by examiner

METHOD AND APPARATUS FOR PRODUCING A REFLECTION-REDUCING LAYER ON A SUBSTRATE

CROSS REFERENCE TO RELATED APPLICATIONS

The present application is a 35 U.S.C. §371 national stage entry of PCT/EP2012/004093, which has an international filing date of Sep. 28, 2012, and claims priority to German Patent Application No. 102011114450.5, filed on Sep. 28, 2011. The present application incorporates herein by reference the disclosures of each of the above-referenced applications in their entireties.

The invention relates to a method for producing a reflection-reducing layer on a surface of a plastic substrate. Furthermore, the invention relates to an apparatus for carrying out this method.

When producing optical components composed of transparent plastic, it is often desirable to give these components an antireflective property and thereby to improve the optical properties of these components. Such an antireflective property can be achieved by applying an antireflection coating, in particular in the form of a multilayer system, to the surface of the substrate. Alternatively, the surface can be provided with a micro- or nanostructure; such a structuring has the advantage that a wide-band antireflective property can be obtained with good reproducibility.

DE 102 41 708 B4 describes a method for reducing the reflection of plastic substrates, in which a nanostructure is formed at a surface of the plastic substrate with the aid of a plasma etching process. Said nanostructure is produced by bombarding the substrate surface with high-energy ions generated by a plasma ion source. However, this etching method is associated with comparatively long process times. Furthermore, the process times differ greatly for different substrate materials, which makes it more difficult to process different materials in one work operation.

In order to solve this problem, DE 10 2006 056 578 A1, forming the generic type, proposes applying a thin layer, in particular a thin oxide layer, to the plastic substrate before the plasma etching process. Said oxide layer leads to a shortening of the process times in the subsequent plasma etching process and furthermore has the effect that the required process times differ from one another only insignificantly for different materials. The thin layer is preferably produced by reactive sputtering. After the thin layer has been applied, a nanostructure is produced on the substrate surface by means of plasma etching, said nanostructure typically extending between 50 nm and 200 nm into the plastic substrate. Afterward, a transparent protective layer can be applied, which protects the nanostructure against external effects, in particular against mechanical damage.

DE 10 2005 049 280 A1 proposes a method for producing a nanostructure on a surface of a plastic substrate, in which firstly a uniform carrier layer and subsequently an insular layer are applied to the surface. The insular layer acts as a mask layer in a subsequent etching process, in which the carrier layer is structured. The etching process can be carried out by means of reactive ion etching, for example. The structured carrier layer serves as an etching mask in a further etching process, in which the desired nanostructure is produced on the surface of the substrate.

DE 10 2007 059 886 A1 furthermore discloses a method for the nanostructuring of a surface of an optical element, in which firstly a liquid resist layer is applied to the surface and partly solidified by irradiation with UV light or by heat treatment. A nanostructure is subsequently produced by a plasma etching method at the surface of the resist layer. Afterward, the nanostructured resist layer is completely cured by further irradiation with UV light or by further heat treatment.

While said documents disclose different methods for producing reflection-reducing coatings for optical elements, they make no proposals whatsoever for an apparatus which is suitable for producing such coatings with a mass-production capability. Conventionally, installations which operate in batch mode are used for carrying out such methods, for which reason the installation has to be ventilated between the individual process steps. This continual ventilation of the installation after each processing step and the fluctuating residual gas composition associated therewith detrimentally affect the reproducibility of the surface processing produced on the substrate. Furthermore, the throughput of these installations is limited on account of long charging and pumping times. The homogeneous deposition of thin layers on all substrates of a batch proves to be difficult, thereby detrimentally affecting the reproducibility within a batch.

Consequently, the invention is based on the object of providing a method and an apparatus by means of which the surface of plastic substrates can be modified by a plasma treatment in such a way that an effective antireflective property of the plastic surface is achieved. The apparatus is intended to ensure a good reproducibility, be simple and cost-effective to implement and to enable a high throughput and a fully automatic process sequence.

The object is achieved by means of the features of the independent claims. The dependent claims relate to advantageous configurations.

The apparatus according to the invention for the surface treatment of plastic substrates comprises a vacuum chamber, in which those process stations which are required for said surface treatment are jointly accommodated. The plastic substrates can consist of PMMA, polycarbonate or such plastics which are suitable for optical applications such as lenses. The plastic substrates are situated on a conveying apparatus used to move them from process station to process station.

A first process station is a sputtering station, in which a base layer is applied to the substrate by means of a first sputtering device. The second process station comprises a plasma source and serves for the plasma etching treatment of the coated substrate surface. Preferably, in a further sputtering station, a protective layer is applied to the processed substrate surface by means of a second sputtering device. Furthermore, the apparatus comprises feeds for admitting process gases in the process stations in a controlled manner, and locks for leading the substrates in and out under vacuum.

In contrast to conventional coating apparatuses operating in batch mode, the apparatus according to the invention enables a high-quality, efficient and cost-effective surface treatment of plastic substrates. The residual gas level in the interior of the vacuum chamber is low and the residual gas composition is constant, which allows a reproducible process control. Moreover, the apparatus according to the invention enables a fully automatic process sequence (e.g. for the antireflective coating of small plastic lenses).

A plasma source known from DE 10 2009 018 912 A1 is preferably used as the plasma source. This plasma source comprises a plasma space, an excitation electrode and a magnetic north pole and a magnetic south pole, wherein the two magnetic poles are in each case arranged on a side facing away from a plasma behind the excitation electrode and are directed into the interior of the plasma space. This results in the formation of a curved magnetic field projecting into the interior of the plasma space, and a tunnel-like region in which charged particles can be held and along which they can propagate. This plasma source is distinguished by particularly low thermal emission, which is of crucial importance for the plasma treatment of plastic substrates. As a result, both during the reactive plasma-enhanced application of base layer and protective layer and during the reactive plasma etching process, it is possible to obtain low temperatures of the substrate of far less than 100° C., for example at substrate temperatures of <80° C., in particular <60° C.

Furthermore, at least with the specified plasma source from DE 10 2009 018 912 A1, and furthermore at least at substrate temperatures of <80° C., preferably <60° C., or at substrate temperatures in a range of between 50° C. and 80° C., the method can be carried out with a distance between the grid of the plasma source and the substrate surface of 50-100 mm, without through an excessively high energy input into the substrate occurring, in particular at a plasma power of between 200 watts and 400 watts. In this case, it can be particularly expedient if the power density of the plasma source relative to the area of the extraction electrode is 0.5-1.5 W/cm$^2$.

The conveying apparatus serves for continuously and repeatedly transporting the plastic substrates from process station to process station. A rotating plate with which high rotational speeds of up to 240 rmp can be achieved is preferably used as the conveying apparatus. These high conveying speeds ensure—even when applying thin layers—homogeneous layer thicknesses on all plastic substrates of a batch, which ensures a high reproducibility within said batch. One preferred embodiment of the configuration of conveying apparatus—sputtering device—plasma source—sputtering device is presented in WO 2004/050944 in the name of the Applicant.

Furthermore, the apparatus can be embodied as an in-line installation with an arrangement of processing stations along the conveying apparatus: sputtering device—plasma source—sputtering device and optionally additionally a topcoat source.

For the treatment of relatively large plastic substrates, a drum installation can be used as the conveying apparatus. Here the substrates are arranged on the outer wall of a rotatable drum, and the processing devices or sources are situated opposite the outer side of said drum.

Provision is expediently made of a measuring device for the in-situ measurement of the transmission and/or reflection of the substrate. This measuring apparatus serves for monitoring the substrate during the entire treatment process and for automatically switching off at least the active plasma etching treatment.

The method according to the invention for the antireflective coating of the surface of a plastic substrate is a multi-stage process. Firstly, a thin dielectric base layer is applied to the substrate with the aid of a sputtering method. The plastic surface subjected to sputtering in this way is subsequently processed by reactive plasma etching; in this case, a structure having an antireflective effect is produced on the plastic surface. The structured plastic surface is subsequently provided with a protective layer which mechanically stabilizes the modified plastic surface and which additionally brings about an optimization of the first two process steps.

Applying the base layer is effected by means of a plasma-enhanced reactive sputtering method. The base layer preferably comprises oxides, fluorides or nitrides of the elements Ti, Zr, Cr, Si, Al, Ta, Nb and/or Hf. The thickness of the base layer is preferably between 1 and 5 nm, particularly preferably between 1 and 3 nm.—The plasma etching is preferably effected in an oxygen-containing atmosphere.

The protective layer is preferably likewise—like the base layer—applied by means of a plasma-enhanced reactive sputtering method. In particular oxides of the elements Si and/or Al have proved to be expedient as materials for the protective layer. The thickness of the protective layer is preferably between 5 and 50 nm, particularly preferably between 10 and 30 nm.

In addition to the protective layer, a further layer (so-called topcoat) can be applied in order to provide the plastic surface with a defined surface tension and, in particular, in order to obtain superhydrophobic properties. Such a hydrophobic layer has a dirt—and/or water—repellant effect. The hydrophobic layer is advantageously applied by means of plasma polymerization. The layer thickness of the topcoat is typically between 1 and 20 nm, preferably between 3 and 10 nm.

In order to conserve the plastic substrate, the method steps are preferably carried out at low substrate temperatures of <100° C., preferably <70° C., particularly preferably 60° C.

The invention is explained in greater detail below on the basis of an exemplary embodiment illustrated in the figures, in which.

Figure 1:
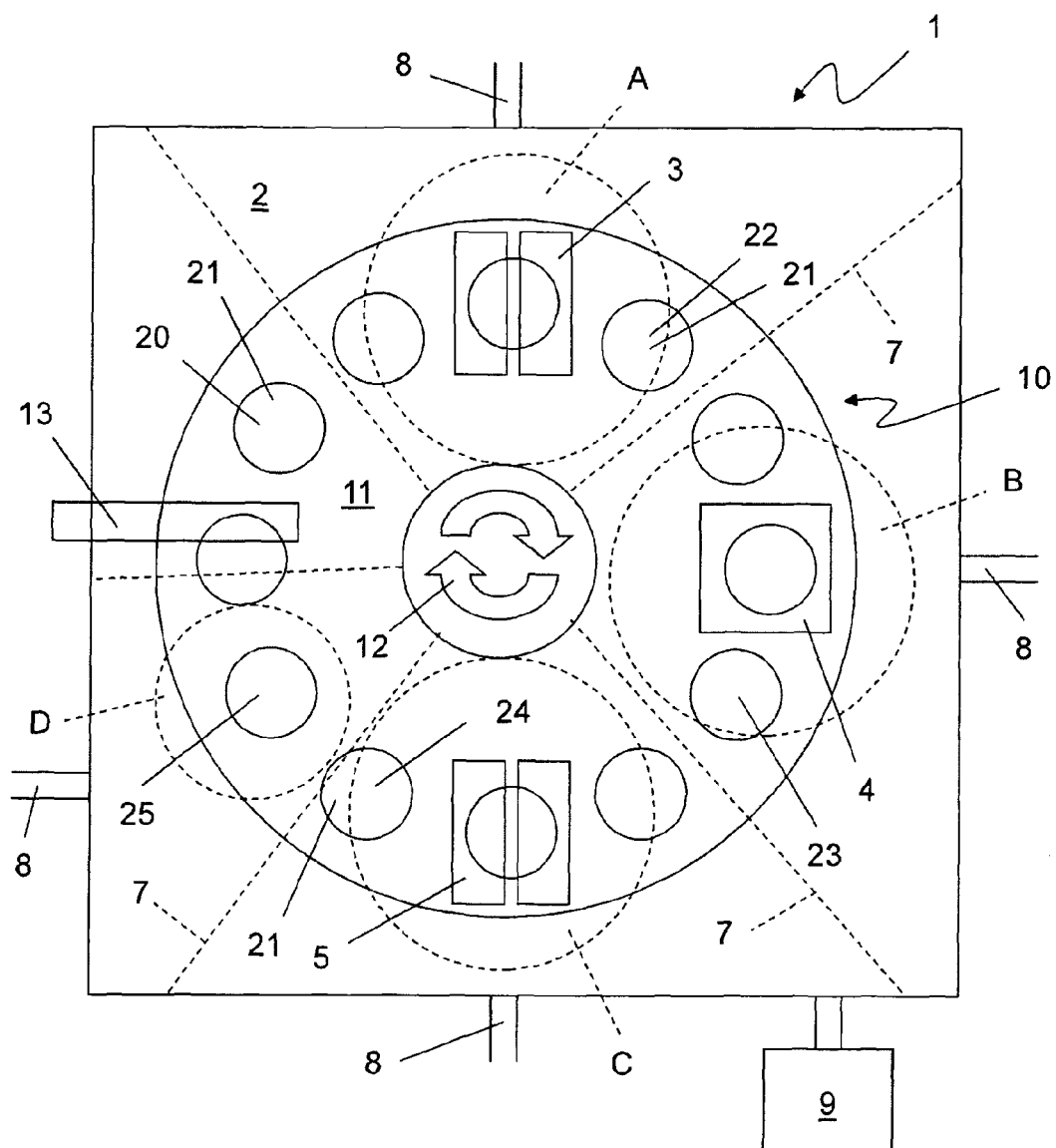
FIG. 1 shows a schematic illustration of an apparatus according to the invention for the surface treatment of a plastic substrate.

In the drawings, mutually corresponding elements are designated by the same reference signs. The drawings illustrate a schematic exemplary embodiment and do not reproduce specific parameters of the invention. Furthermore, the drawings serve only for elucidating an advantageous embodiment of the invention and should not be interpreted in such a manner as to narrow the scope of protection of the invention.

FIG. 1 shows a schematic view of an apparatus 1 for producing a reflection-reducing layer on a surface 21 of a substrate 20. FIG. 1 shows a plurality of substrate disks 20 arranged in a circular arrangement on a rotating plate 11, only some of which substrate disks are provided with reference signs for reasons of clarity. The substrate disks 20 consist of a plastic, for example of PMMA.

The apparatus 1 comprises a vacuum chamber 2, in the interior of which a plurality of process stations A, B, C are arranged. Situated in process station A is a first sputtering device 3, in which a base layer 22 is applied to the substrate surface 21 using a plasma-enhanced reactive sputtering method. The sputtering device 3 is preferably a magnetron source system comprising two magnetron arrangements 5 arranged alongside one another and comprising two niobium targets arranged alongside one another. The targets are assigned shutters that can be used to isolate the sputtering device from the substrates 20.

The second process station B contains a plasma source 4, by means of which a plasma etching treatment of the coated substrate surface 21 is carried out, as a result of which the substrate surface acquires a nanostructuring 23. The plasma source 4 comprises a plasma vessel with an extraction electrode and an RF excitation electrode having an excitation area, which is connected to an RF generator via a matching network. The excitation electrode can be thermally coupled to a cold reservoir and is operated at room temperature. The excitation electrode can be embodied as an aluminum electrode, for example, which is bonded on a water-cooled copper plate.

A plasma space in which a plasma can be excited lies between the excitation area and the extraction electrode, the area of the extraction electrode and of the excitation area being designed in such a way that virtually the entire radiofrequency voltage is dropped at the extraction electrode. Furthermore, a magnet apparatus for generating a magnetic field is provided, which has a magnetic north pole and a magnetic south pole which are in each case arranged on a side facing away from the plasma space behind the excitation electrode and are directed into the interior of the plasma space. A curved magnetic field projecting into the interior of the plasma space is formed in this way. A tunnel-like region in which charged particles are held and along which they propagate is formed between the north and south poles. Ion density and ion energy are set by way of the magnetic field strength of the plasma source. Such a plasma source 4 is described in DE 10 2009 018 912 A1, for example, the entire disclosure content of which is incorporated by reference in the present application.

The plasma source 4 is likewise assigned a shutter, such that an effect of the plasma source 4 on the substrate 20 can be switched on and off in a targeted manner. In a third process station C, a protective layer 24 is applied to the processed substrate surface 21 by means of a second sputtering device 5. The second sputtering device 5 is preferably identical to the first sputtering device 3 and likewise has shutters. In a process station D, a hydrophobic topcoat 25 can additionally be applied as a further protective layer in order to make the coating insensitive to dirt and moisture.

The process stations A, B, C, D are preferably screened from one another by screens 7 and connected to one another only by slots in said screens 7. In this way, the process stations A, B, C, D are separated in terms of vacuum.

At least one vacuum pump 9 is provided for evacuating the vacuum chamber 2. Furthermore, the vacuum chamber 2 contains at least one connection 8 for introducing process gases in a targeted manner; preferably, each process station A, B, C, D has its own connection 8 for selectively introducing the process gases required in said station. The partial pressures of the process gases can be set substantially independently of one another in this way. A mixture of an inert gas such as e.g. argon and a reactive gas, preferably oxygen, is preferably used.

As illustrated in FIG. 1, a plurality of substrates 20 can be subjected to surface treatment simultaneously by means of the apparatus 1 according to the invention. The substrates 20 are arranged on a conveying apparatus 10, which is in the form of the driven rotating plate 11 in the present exemplary embodiment. By means of said rotating plate 11, the substrates 20 are conveyed (arrow 12) on a circular path successively through the process stations A, B, C and D and can be moved in particular multiply through the region of action of said process stations, as a result of which the substrate surfaces 21 can be acted on particularly uniformly. Transport from one process station to the next takes place in the interior of the vacuum chamber 2, without the vacuum chamber 2 having to ventilate it. Instead of the rotating plate 11, it is also possible to use a drum apparatus for transporting the substrates 20.

A measuring device 13 serves for the in-situ monitoring of the treated substrate surface 21, in particular for measuring the transmission and/or reflectivity of the substrate surface. The measuring device 13 makes it possible to check the optical properties of the coatings applied to the substrate 20 and can be used, in particular, for monitoring the layer thicknesses of the layers growing on the substrate 20.

With the apparatus 1, the surface of a plastic substrate 20 can be modified by means of reactive sputtering and plasma etching in such a way that the reflection at said surface is reduced in a wide-band manner.

In order to carry out the treatment, the substrate disks 20 to be treated are introduced into the vacuum chamber 2 through a lock (not shown in FIG. 1) and positioned on the rotating plate 11. Afterward, the vacuum chamber 2 is closed and suitable partial pressures for inert gas (in particular argon) and reactive gas (e.g. oxygen) are set in process station A. The sputtering device 3 is set to a defined operating point, the shutters being closed in order to stabilize the process. The rotating plate 11 of the conveying apparatus 10 is accelerated to a desired speed. The coating of the substrate 20 is then begun. For this purpose, the shutters are opened, such that the thin base layer 22 is deposited onto the substrate surfaces 21 with the aid of the sputtering device 3. The desired layer thickness can be controlled by way of a coating time or by way of a number of rotations of the rotating plate 11.

A preferred embodiment of the plasma source is explained in greater detail below.

Figure 1A:
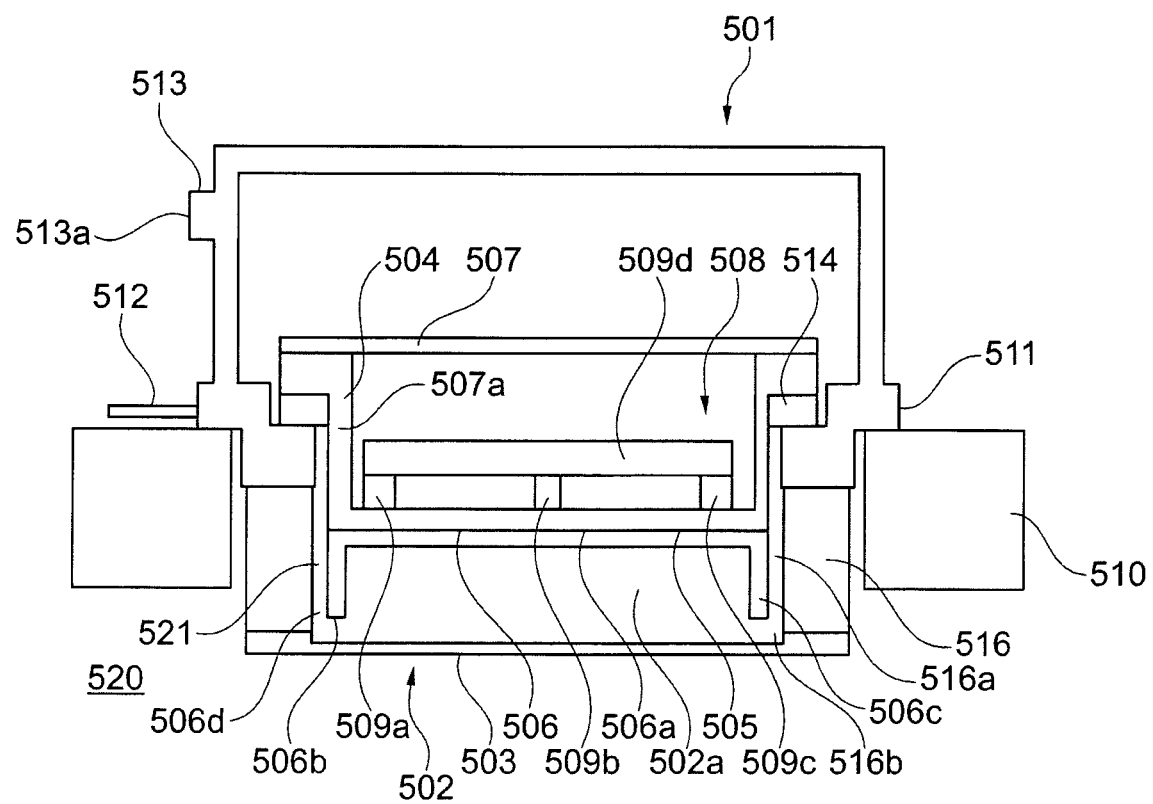
FIG. 1a shows a schematic illustration of a plasma source used in an apparatus according to FIG. 1.

FIG. 1a shows in a schematic illustration a cross section of an RF plasma source 501 according to the invention, which is incorporated into a vacuum chamber 510 and comprises a plasma vessel 502, an extraction electrode 503 and an RF electrode device 504. Process and reactive gases such as argon and oxygen can be introduced into the plasma vessel 502 via a gas feed device 512.

The plasma vessel 502 has a front side and a rear side, between which the plasma space 502a is situated. The plasma vessel 502 furthermore has side walls 516, which project into the interior 520 of the vacuum chamber 510 and to the end sides of which the extraction electrode 503 forming the front side of the plasma vessel 502 is fitted, said extraction electrode thus permeably delimiting the plasma space 502a relative to the interior 520 of the vacuum chamber. The extraction electrode 503 can also be embodied in a curved fashion.

The plasma vessel 502 can have a rectangular or round shape in a perpendicular plane with respect to the plane of the drawing in FIG. 1a. The base area—which is planar in FIG. 1a—of the excitation electrode 506 can also be embodied concavely or convexly relative to the extraction electrode. It goes without saying that other shapes of the plasma vessel 502 are also conceivable and encompassed by the invention.

The plasma source is fixed with a flange 511 in an opening of a vacuum chamber wall 510. In the exemplary embodiment in FIG. 1*a*, the extraction grid 503 and the wall 516 are electrically connected to the vacuum wall chamber wall 510 and are at earth potential.

The plasma source 501 has an RF electrode device 504 arranged partly outside the plasma vessel 502, with an electrode mount 507, which is connected to the side walls 516 of the plasma vessel 502 in a manner electrically isolated from the plasma vessel 502 by means of an isolator element 514 and comprises a plate-shaped element 505 held by holding elements 507*a* that project into the interior of the plasma vessel 502. The electrode mount 507 has a bath tub-like shape in cross section. The electrode device 504 is separated from the surroundings by a protective cover 513 at the rear side, wherein RF power can be applied or is applied to the RF electrode device 504 via an RF supply 513*a*, which can be connected or is connected to an RF generator. An RF matching network is indeed present, but not illustrated in the drawing.

The front side of the plate-shaped element 505 is oriented toward the interior 520 of the vacuum chamber. The pot-like excitation electrode 506 is fitted to the front side of the plate-shaped element 505, which electrode has an excitation area on its inner side 506*a* oriented toward the interior 520 of the vacuum chamber and with its outer side 506*d* is at least partly in contact with the front side of the plate-shaped element 505. The excitation electrode 506 has a planar base and side walls 506*c* fitted thereto with end regions (end faces) 506*b* that project into the plasma space 502. Preferably, excitation electrode 506 and element 505 are bonded in order to ensure a good thermal and electrical contact between the plate-shaped element 505 and the excitation electrode 506. The excitation electrode 506 can consist of aluminum and the element 505 can be embodied as a water-cooled copper plate. The side walls 506*c* are formed by a wall of the excitation electrode 506.

The side walls 516 of the plasma vessel and the side walls 506*c* of the excitation electrode are arranged close together and separated from one another by a gap 521 dimensioned such that no plasma can form between the excitation electrode 506 and the side wall 516 during the operation of the plasma source. Therefore, the side walls 516 of the plasma vessel 502 realize a dark space shield with a shielding area 516*a* of the excitation electrode 506 in the region of the gap 521.

The side walls 516 of the plasma vessel 502 project in the direction of the interior 520 of the vacuum chamber with a region beyond the side walls 506*c*, such that, during the operation of the plasma source 501 that region of the side walls 516 which projects beyond the end region 506*b* of the side walls 506*c* is in contact with the plasma and forms a plasma electrode with a plasma electrode area 516*b*.

During the operation of the plasma source 501, the size of the DC self-bias between the excitation electrode 506 and the extraction electrode is determined by the size ratio of the excitation areas 506*a* and 506*c* to the area of the extraction electrode 503 and the size of the plasma electrode area 516*b*, i.e. those parts of the side walls 516 of the plasma vessel 502 which are in contact with the plasma.

The magnet apparatus 508 having magnets 509*a*, 509*b*, 509*c* and also having a pole shoe 509*d* is arranged on the rear side of the excitation area 506*a* and of the plate-shaped element 505. The magnets 509*a*, 509*b*, 509*c* each comprise a magnetic north pole and a magnetic south pole which are arranged with alternate polarity and are directed into the interior of the plasma space 502*a*, thus resulting in the formation of a curved magnetic field projecting into the interior of the plasma space, as is known per se for example from DE 241 728 8 C2 or DE 243 183 2 B2. The magnets 509*a*, 509*b*, 509*c* can be embodied as permanent magnets or as solenoids which are connected or can be connected to a power supply.

Even at low plasma power densities of 0.5-1.5 W/cm$^2$, the plasma source described supplies high current densities of 0.5-0.8 mA/cm$^2$ at ion energies of 300-400 eV. It is thus possible to achieve highly effective etching associated with low thermal loading.

The coating is effected by reactive sputtering of a metal (e.g. Al, Nb, Hf, Ta, Ti, Zr), of an alloy (e.g. TiNb) or of a semiconductor (e.g. Si), in an oxygen atmosphere, such that an oxide layer 22 as base layer is applied to the substrate surface. $ZrO_2$ has proved to be particularly advantageous. The thickness of the $ZrO_2$ base layer is advantageously between 1 nm and 3 nm.

Once the desired layer thickness of the base layer 22 has been attained, the substrate surface 21 is subjected to a plasma etching treatment with the aid of the plasma source 4 in process station B. In advance of the plasma treatment, a reactive gas or a gas mixture in a suitable concentration is introduced via the inlet 8 of the process station B and the plasma is ignited. The plasma source 4 is advantageously operated with a power of between 100 W and 400 W, at a constant oxygen flow rate of 10 sccm/min. Once the desired method parameters have been attained, the shutter of the process station B is opened and the plasma treatment is begun.

When the desired modification of the surface has been attained, the shutter of the process station B is closed, and the substrate is subjected to a further coating by means of reactive sputtering with the aid of the second sputtering device 5 located in process station C. In this case, a protective layer 24 is deposited onto the substrate surface. In particular an $SiO_2$ layer having a layer thickness of approximately 20 nm can be used as the protective layer 24.

The results of each individual process step can be checked with the aid of the measuring device 8, for example by a measurement of the optical transmission of the substrate disks 20.

Concrete measurements on substrates composed of PMMA 8H which was coated and subjected to surface treatment by means of such a method are shown in FIGS. 2 to 7. It goes without saying that other plastic materials, such as polycarbonates for example, can also be used.

Figure 2:
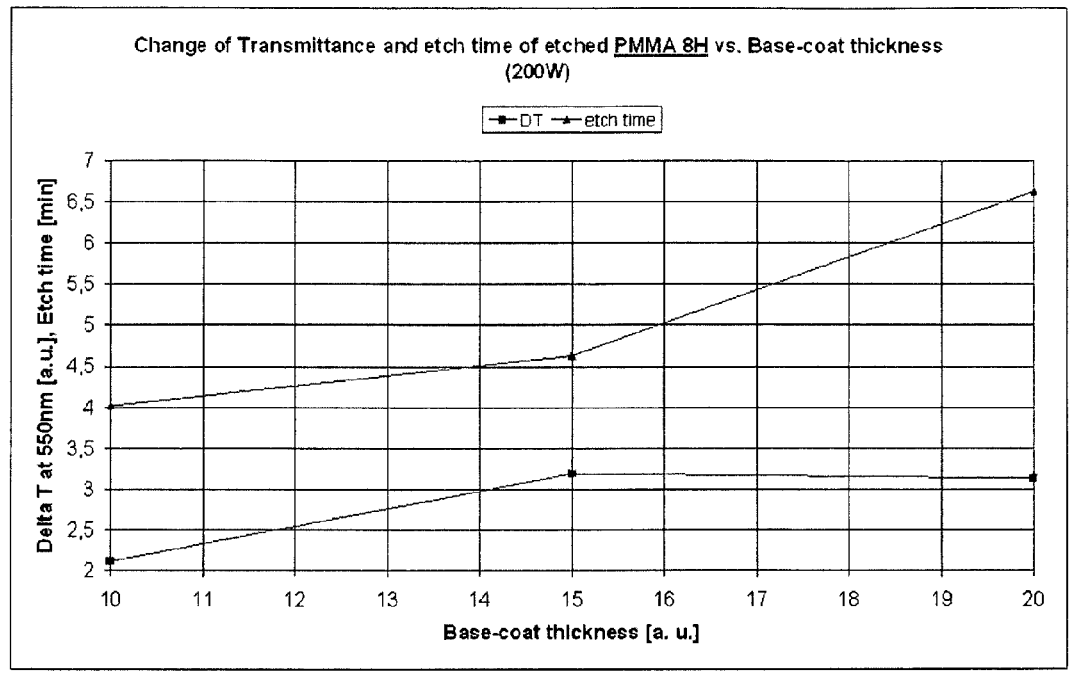
FIG. 2 shows a diagram of the change in the transmission coefficient and the plasma etching time of a substrate composed of PMMA 8H, as a function of the layer thickness of a base layer applied before the plasma treatment.

The diagram in FIG. 2 shows the dependence of the plasma etching time (processing time in the process station B) required for producing a desired surface structuring as a function of the layer thickness of the base layer (applied in process station A) with a constant power of the plasma source (200 W). Furthermore, the illustration shows the change in the transmission as a function of the layer thickness of the base layer. It can be seen that the etching time increases with a larger layer thickness of the base layer; whereas the transmission is approximately constant.

Figure 3:
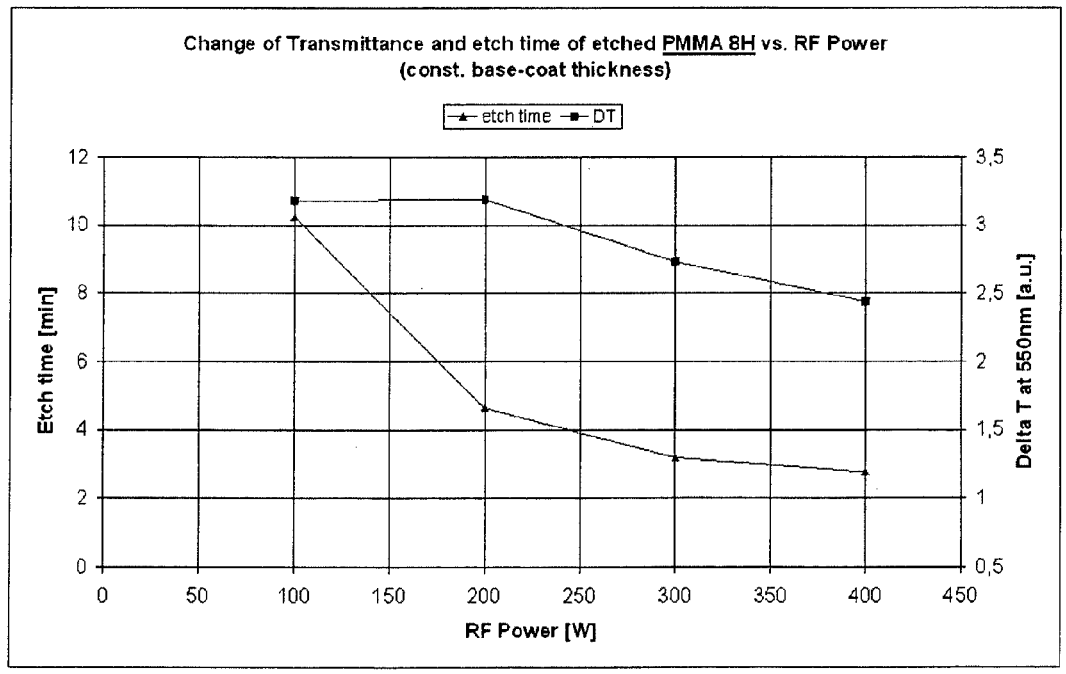
FIG. 3 shows a diagram of the change in the transmission coefficient and the plasma etching time of a substrate composed of PMMA 8H, as a function of the plasma power.
Figure 4:
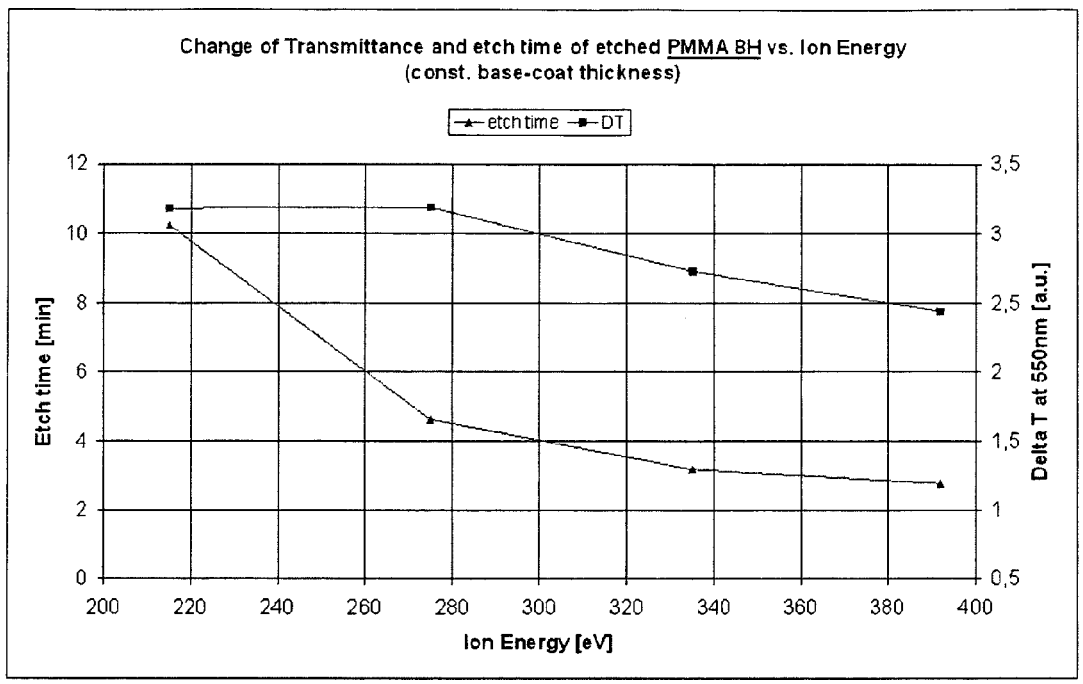
FIG. 4 shows a diagram of the change in the transmission coefficient and the plasma etching time of a substrate composed of PMMA 8H, as a function of the ion energy.

FIG. 3 illustrates the dependence of the plasma etching time on the power of the plasma source. This diagram shows that a reduction of the plasma etching time can be achieved by increasing the plasma power. However, increasing the plasma power above 200 W leads to a decrease in the transmittance of the treated substrate. As can be seen in FIG. 4, increasing the ion energy also leads to a reduction of the plasma etching time, but this also results in a reduction of the transmittance of the substrate treated in this way.

Figure 5:
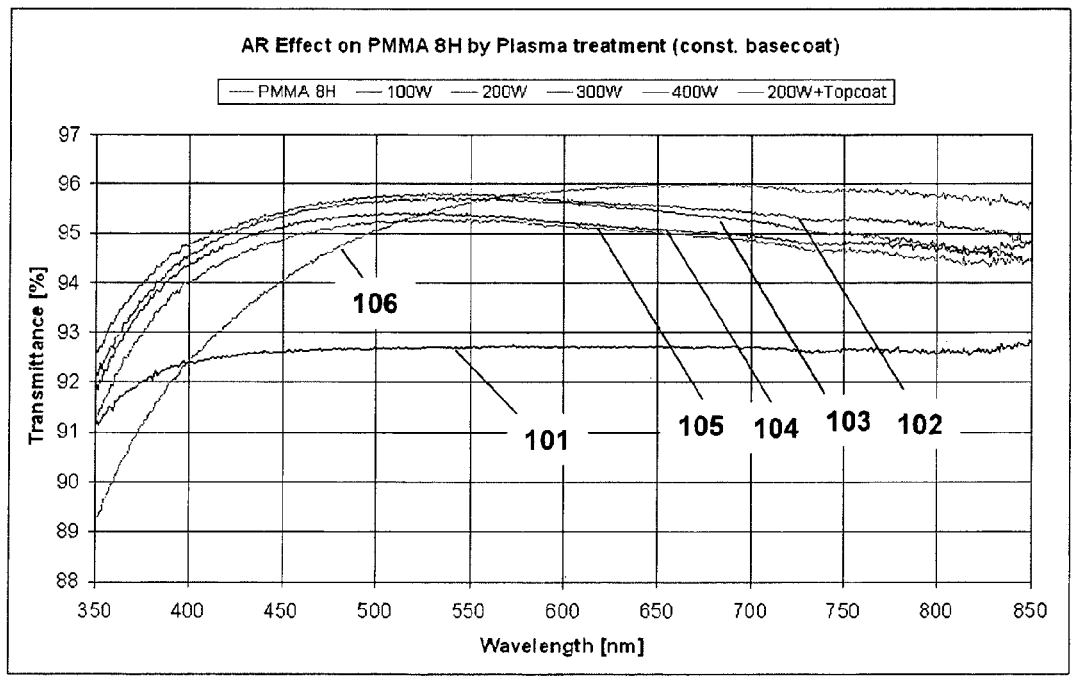
FIG. 5 shows a diagram of the transmission coefficient of a substrate composed of PMMA 8H as a function of the wavelength, for a plurality of samples which were subjected to a plasma etching treatment with different plasma power.

FIG. 5 shows a diagram of the dependence of the transmission coefficient on the wavelength in the case of substrates which were firstly provided with a base coating and then subjected to plasma etching. In this case, the different curves correspond to etching treatments with different plasma powers. If said substrate is not subjected to plasma treatment, then the transmittance in the entire wavelength range shown is 92%-93% (curve 101). With a plasma treatment it is possible to achieve—depending on the power of the plasma source—transmittances of around 95%-96% (curves 102-105). An additional topcoat coating leads to a lower transmission in the blue spectral range, but increases the transmission for light having higher wavelengths in the spectral range (curve 106).

Figure 6:
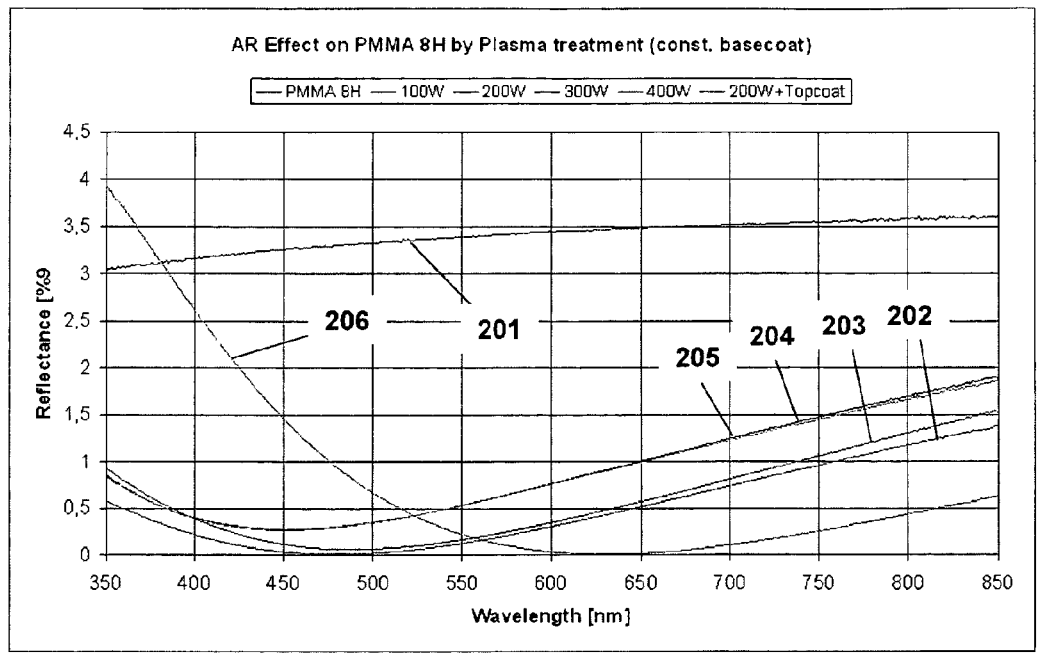
FIG. 6 shows a diagram of the reflectivities of the samples from FIG. 5 as a function of the wavelength.

FIG. 6 shows a diagram of the dependence of the reflectivity on the wavelength for the samples from FIG. 5. Curve 201 corresponds to the reflectivity of a sample which was not subjected to a plasma treatment; here the reflectivity is approximately 3% in the wavelength range considered. If the sample is subjected to a plasma treatment, then the reflectivity in the wavelength range considered is reduced to 1%-2% (curves 202-205). An additional topcoat coating indeed results in an increase in the reflectivity in the blue spectral range, but leads to a considerable reduction in the reflectivity at higher wavelengths (curve 206).

Figure 7:
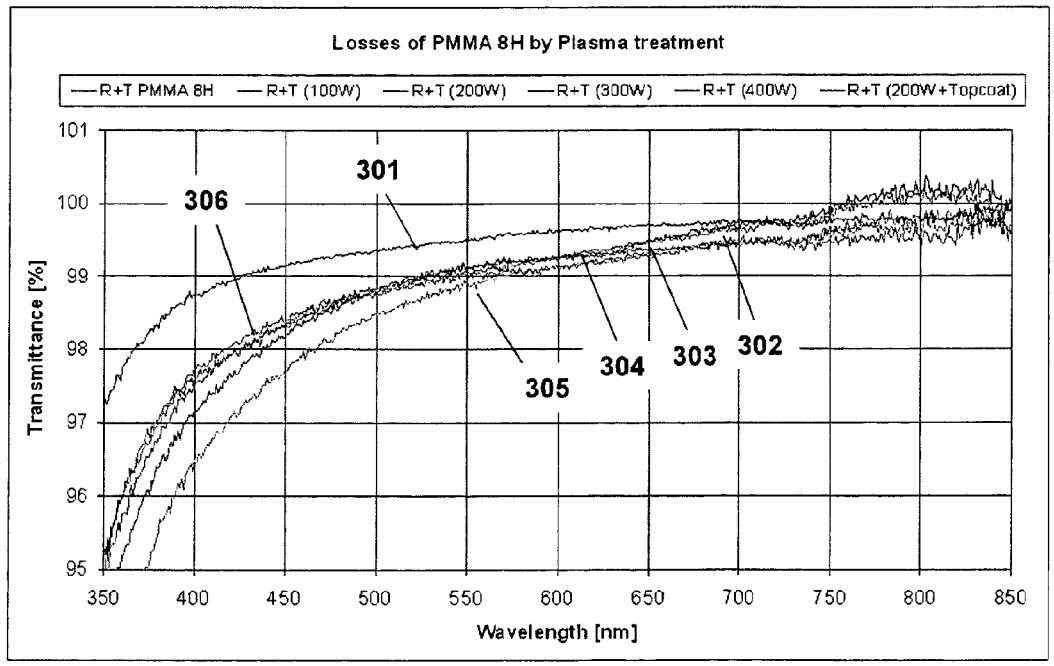
FIG. 7 shows a diagram of the sum of transmission coefficient and reflectivity of the samples from FIG. 5 as a function of the wavelength.

Finally, FIG. 7 shows the sum of the transmission coefficient and reflectivity of the samples from FIG. 5 as a function of the wavelength. Here curve 301 is associated with the sample which was not subjected to a plasma treatment. Curves 302-305 are associated with samples which were etched with different plasma powers. Curve 306 corresponds to a measurement on the sample which was provided with a topcoat coating in addition to a plasma treatment at 200 W.

The invention claimed is:

1. An apparatus for producing a reflection-reducing layer on a surface of a plastic substrate, comprising:
   a vacuum chamber having a plurality of processing stations arranged therein, wherein each processing station is separated from another processing station by a screen and connected to one another by a slot in each screen, the processing stations including:
      a first processing station including a first sputtering device for depositing a base layer on the surface of the plastic substrate;
      a second processing station including a plasma source for a plasma etching treatment on the substrate surface, wherein the plasma source includes an extraction electrode and is configured to operate such that the power density of the plasma source, relative to the area of the extraction electrode, is 0.5-1.5 W/cm$^2$; and
      a third processing station including a second sputtering device for depositing a protective layer on the surface of the substrate;
   at least one inlet connected to at least one processing station for introducing at least one process gas into the vacuum chamber; and
   a conveying apparatus for moving the substrate between the processing stations in the vacuum chamber.

2. The apparatus according to claim 1, wherein the conveying apparatus is a rotating plate or a drum.

3. The apparatus according to claim 1, further comprising a measuring device for in-situ measurement of the transmission and/or reflection of the surface of the plastic substrate.

4. The apparatus according to claim 1, wherein the plasma source is configured to operate with a plasma power of between 200 watts and 400 watts.

5. The apparatus according to claim 1, further comprising a fourth processing station for depositing a hydrophobic layer on the substrate.

6. The apparatus according to claim 1, wherein the plasma source further comprises:
   a plasma space;
   an excitation electrode; and
   a magnet apparatus having a magnetic north pole and a magnetic south pole, wherein the two magnetic poles are each arranged on a side facing away from a plasma behind the excitation electrode and directed into an interior of the plasma space to form a curved magnetic field projecting into the interior of the plasma space and a tunnel-like region in which charged particles can be held and propagated therealong.

7. The apparatus according to claim 6, wherein the excitation electrode has an excitation area which is connectable or connected to an RF generator via a matching network;
   the plasma space in which a plasma can be excited lies between the excitation area and the extraction electrode, and an area of the extraction electrode and the excitation area are configured such that substantially an entire radiofrequency voltage is dropped at the extraction electrode; and
   the magnetic field apparatus is configured as a planar magnetron having at least one magnetic north pole and one magnetic south pole which are each arranged on a side facing away from the plasma space behind the excitation electrode and are directed into the interior of the plasma space.

8. The apparatus according to claim 6, wherein the excitation electrode is operated at a temperature of between 15° C. and 45° C.

9. A method for producing a reflection-reducing layer on a surface of a plastic substrate, comprising:
   depositing a dielectric base layer on the surface of the plastic substrate in a first sputtering device in a first processing station;
   treating the surface with the dielectric base layer by plasma etching with a plasma source in a second processing station, wherein the plasma source includes an extraction electrode and the plasma source produces a power density of 0.5-1.5 W/cm$^2$ relative to the area of the extraction electrode;
   depositing a protection layer on the treated surface in a second sputtering device in a third processing station, wherein the processing stations are arranged in a common vacuum chamber, and each processing station is separated from another processing station by a screen and connected to one another by a slot in each screen; and
   moving the plastic substrate with a conveying apparatus between the processing stations in the vacuum chamber.

10. The method according to claim 9, wherein the depositing of the dielectric base layer comprises employing plasma-enhanced reactive sputtering.

11. The method according to claim 9, wherein the base layer comprises an oxide, nitride or fluoride of the elements Ti, Zr, Cr, Si, Al, Ta, Nb and/or Hf and has a layer thickness of between 1 nm and 5 nm.

12. The method according to claim 9, wherein the treating comprises reactive plasma etching in an oxygen-containing atmosphere.

13. The method according to claim 9, wherein the depositing of the protective layer comprises employing plasma-enhanced reactive sputtering.

14. The method according to any of claim 9, wherein the protective layer comprises an oxide, nitride or fluoride of the elements Si and/or Al and has a layer thickness of between 5 nm and 50 nm.

15. The method according to claim 9, wherein a plasma power of the plasma source is between 200 watts and 400 watts.

16. The method according to claim 9, wherein the plastic substrate is moved between the processing stations in the vacuum chamber without ventilating the vacuum chamber.

17. The method according to claim 9, further comprising depositing a hydrophobic layer in addition to the protective layer, wherein the hydrophobic layer is deposited in a fourth processing station.

18. The method according to claim 17, wherein the hydrophobic layer has a thickness of between 1 nm and 20 nm.

19. The method according to claim 9, wherein one or more of the depositing and treating are performed at a substrate temperature of <100° C.

20. The method according to claim 19, further comprising operating an excitation electrode at a temperature of between 15° C. and 45° C.

21. The method according to claim 19, wherein one or more of the depositing and treating are carried out with a distance between a grid of the plasma source and the substrate surface of 50-100 mm.

22. The method according to claim 19, wherein the substrate temperature is <70° C.

\* \* \* \* \*